(12) United States Patent
Celler

(10) Patent No.: US 7,585,792 B2
(45) Date of Patent: Sep. 8, 2009

(54) RELAXATION OF A STRAINED LAYER USING A MOLTEN LAYER

(75) Inventor: George K Celler, Summit, NJ (US)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 485 days.

(21) Appl. No.: 11/052,885

(22) Filed: Feb. 9, 2005

(65) Prior Publication Data

US 2006/0175608 A1    Aug. 10, 2006

(51) Int. Cl.
*H01L 21/00* (2006.01)

(52) U.S. Cl. .................. 438/795; 438/938; 257/E21.12

(58) Field of Classification Search .................. 438/795, 438/502, 540, 799, 938; 257/E21.12
See application file for complete search history.

(56) References Cited

U.S. PATENT DOCUMENTS

| | | | | |
|---|---|---|---|---|
| 4,670,086 A | | 6/1987 | Leamy | 156/620 |
| 4,806,996 A | * | 2/1989 | Luryi | 257/190 |
| 5,401,687 A | * | 3/1995 | Cole et al. | 438/125 |
| 5,468,678 A | * | 11/1995 | Nakamura et al. | 438/509 |
| 5,783,486 A | * | 7/1998 | Tseng | 438/682 |
| 5,962,873 A | * | 10/1999 | Ohkubo et al. | 257/94 |
| 6,100,166 A | | 8/2000 | Sakaguchi et al. | 438/455 |
| 6,107,113 A | * | 8/2000 | Harmand et al. | 438/46 |
| 6,326,667 B1 | | 12/2001 | Sugiyama et al. | 257/347 |
| 6,461,945 B1 | * | 10/2002 | Yu | 438/510 |
| 6,566,198 B2 | * | 5/2003 | Park et al. | 438/259 |
| 6,589,364 B1 | | 7/2003 | Essaian et al. | 148/239 |
| 6,767,802 B1 | * | 7/2004 | Maa et al. | 438/406 |
| 2003/0168654 A1 | * | 9/2003 | Cheng et al. | 257/19 |
| 2004/0048450 A1 | * | 3/2004 | Tweet et al. | 438/478 |
| 2004/0221792 A1 | | 11/2004 | Forbes | 117/4 |
| 2004/0238885 A1 | * | 12/2004 | Bedell et al. | 257/347 |
| 2005/0082548 A1 | * | 4/2005 | Sakong et al. | 257/79 |

FOREIGN PATENT DOCUMENTS

| | | |
|---|---|---|
| EP | 0 849 788 A2 | 12/1997 |
| WO | WO 2006/086024 A1 | 8/2006 |

OTHER PUBLICATIONS

Höllander, B. et al.,"Strain relaxation of pseudomorphic $Si_{1-x}Ge_x$ / Si(100) hetero structures after hydrogen or helium ion implantation for virtual substrate fabrication", Nuclear and Instruments & Methods in Physics Research B 175-177 (2001) 357-367.

(Continued)

*Primary Examiner*—Matthew C Landau
*Assistant Examiner*—Daniel Luke
(74) *Attorney, Agent, or Firm*—Winston & Strawn LLP

(57) ABSTRACT

A method for making a crystalline wafer, in which an interface layer is associated with a support substrate. A first layer is associated with the interface layer in a strained state. The interface layer is melted sufficiently to substantially uncouple the first layer from the support substrate to relax the first layer from the strained to state to a relaxed state. The interface material is solidified with the first layer in the relaxed state to obtain a first wafer.

24 Claims, 3 Drawing Sheets

OTHER PUBLICATIONS

Leamy, H.J. et al., "Nucleation-controlled overgrowth of silicon on silica", Appl. Phys. Lett. 37(11), Am. Inst. of Physics, Dec. 1, 1980, 1028-1030.

Liu, Y. et al., "High-quality single-crystal Ge on insulator by liquid-phase epitaxy on Si substrates", Appl. Phys. Lett. 84(14), Am. Inst. of Physics, Apr. 5, 2004, 2563-2565.

Kutsukake, K. et al., "Fabrication of SiGe-on-insulator through thermal diffusion of Ge on Si-on-insulator substrate", Jpn. J. Appl. Physics, 42 (2003) L232-L234.

Sugii et al., "SiGe-on-insulator substrate fabricated by melt solidification for a strained-silicon complementary metal-oxide-semiconductor," J. Vac. Sci. Technol. B 20(5): 1891-1896 (2002).

* cited by examiner

RELAXATION OF A STRAINED LAYER USING A MOLTEN LAYER

FIELD OF THE INVENTION

The present invention relates to the fabrication of crystalline wafers, and more particularly to manufacturing a multicrystalline wafer by melting or heating a layer.

BACKGROUND OF THE INVENTION

Certain techniques for manufacturing semiconductor wafers involve producing a layer of a first crystalline material on a substrate of a second crystalline material that has a different nominal lattice parameter. The crystalline structure of the second material is sometimes desired to be relaxed. A known technique provides a buffer layer between the substrate and the produced layer of different nominal lattice parameter.

A typical buffer layer is a transition layer that matches the lattice parameter of the produced layer with that of the substrate. Such a buffer layer may have a composition that gradually varies along its depth by providing the buffer layer with a gradually varying composition. Buffer layers are also known with complex configurations, such as with a compositional variation or discontinuous step changes in composition. The formation of the variable composition in the buffer layer takes considerable time and expense and requires care to implement. Also, to minimize the density of crystallographic defects in the buffer layer, the thickness of a buffer layer is usually large, typically between one and several microns.

Another technique known relaxes elastic strains in a formed layer. Such a technique is disclosed in an article by B. Höllander et al. entitled, "Strain relaxation of pseudomorphic $Si_{1-x}Ge_x/Si(100)$ heterostructures after hydrogen or helium ion implantation for virtual substrate fabrication" (in Nuclear and Instruments and Methods in Physics Research B 175-177 (2001) 357-367). The described process relates to the relaxation of a strained SiGe layer in compression, with this layer being formed on an Si substrate.

In this technique, hydrogen or helium ions are implanted through the surface of the strained layer into the Si substrate to a defined depth. A crystalline perturbation is created by the ion implantation and located in a thickness of the Si substrate lying between the implantation region and the SiGe layer, and this perturbation allows the SiGe layer to relax when subjected to a heat treatment.

A simple process is thus needed to readily relax a strained layer, which can be used in the production of crystalline wafers.

SUMMARY OF THE INVENTION

In the preferred method, an interface layer is associated with a support substrate, and a first layer is associated in a strained state with the interface layer. The interface layer is melted sufficiently to substantially uncouple the first layer from the support substrate to relax the first layer from the strained state to a relaxed state, in which the first layer is substantially more relaxed than in the strained state. Preferably, this relaxed state can be substantially a completely relaxed state, in which the lattice parameter of the now relaxed layer is substantially equal to its nominal lattice parameter. The interface material is preferably solidified with the first layer in the relaxed state to obtain a first wafer that includes the support substrate, the interface layer and the first layer in the relaxed state, i.e., the first layer is more relaxed than it was prior to the melting.

The interface material preferably has a melting temperature that is lower than that of the materials of the support substrate and first layer. The interface material is preferably melted by heating a sufficient portion of the interface material, preferably, at least to the interface melting temperature, to allow the first material to relax. The interface material can be solidified by cooling. Preferably, the interface layer is cooled at a sufficiently rapid rate to solidify the interface layer sufficiently rapidly to avoid any or any substantial diffusion of the interface and first materials between the interface and first layers. The interface layer can be heated by applying heat to the first and interface layers as well as to the support substrate, such as in a single operation. A preferred method of heating is by rapid thermal annealing (RTA), and more preferably by RTA-spike annealing which takes fractions of a second instead of several seconds. Preferably, the melting temperature of each of the first and supporting material is at least about 5°C higher than the melting temperature of the interface material.

In one embodiment, the first material comprises silicon germanium, and the interface material comprises a higher concentration of germanium than the first material. In this embodiment, the interface layer can comprise germanium or silicon germanium, for instance.

The interface layer is preferably a thin film compared to the first layer and can be grown epitaxially on the support substrate. The first layer can advantageously be patterned in some embodiments to provide substantial separate regions of the first layer to be relaxed.

In some processes, a receiving substrate, which can be a multi-layered wafer, is associated on the surface of the first wafer, and at least a portion of the first layer can be detached at least from the support substrate for transferring to a receiving substrate, for example after conducting a surface treatment on the surface that is to be bonded to the receiving substrate.

Preferably, the support substrate has a support lattice parameter, and the first layer has a first nominal lattice parameter that is different than the support lattice parameter. Also, the preferred first layer is epitaxially grown on the interface layer.

In one embodiment, a cap is associated with the first layer to protect this layer during the melting of the interface layer. The cap can include a supportive cap layer that provides support or other protection to the first layer when the interface layer is melted, and a boundary layer between the first layer and the supportive cap layer. The boundary layer can be configured for separating the first layer from the supportive cap layer to substantially prevent diffusion therebetween during the heating period. The boundary layer can also be made of the interface material and is also preferably a thin film compared to the first layer. In one embodiment, the boundary layer is also melted to mechanically uncouple the first layer from the supportive cap layer to inhibit or prevent the supportive layer from impeding or undesirably affecting the relaxation of the first layer.

In a preferred crystalline wafer constructed according to the invention, a first layer of a first material in a relaxed state, having a lattice parameter that is substantially equal to the nominal lattice parameter of the first material, is associated with an interface layer in at least partially molten state. The interface layer is disposed between the first and a support substrate. A cap layer can be provided in protective association with the first layer, such as providing mechanical support therefor.

The invention thus provides a simple manner of relaxing a layer that can have a different lattice parameter than a layer on which it is grown or from which it otherwise depends or is supported.

DETAILED DESCRIPTION OF THE PREFERRED EMBODIMENTS

Figure 1:
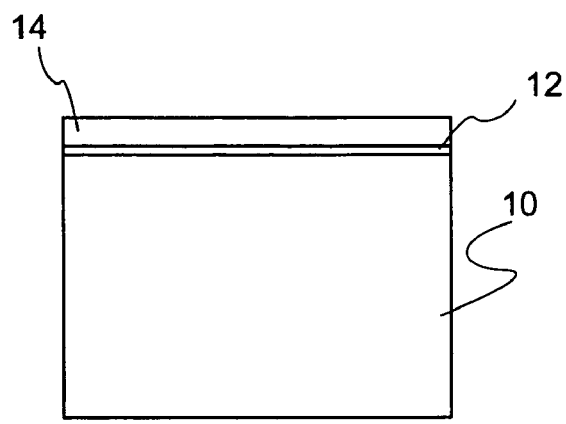
FIG. 1 is a side, diagrammatic view of a wafer constructed according to the present invention for relaxing a layer thereof.

Referring to FIG. 1, in a preferred method of producing a wafer with a high quality, crystalline relaxed layer, a composite structure is produced. The structure includes support substrate 10, which in the preferred embodiment is made of silicon. The support substrate 10 can alternatively include several layers, preferably with a crystalline layer at its top, such as of a semiconductor material.

An interface layer 12 is associated with the support substrate 10, and a strained layer 14, which is preferably crystalline, is associated with the interface layer 12. Thus, the interface layer 12 is preferably sandwiched between the support substrate 10 and the strained layer 14.

Preferably, the nominal lattice parameter of the support substrate 10 and the strained layer 14 are different, such that when associated on the interface layer 12, the strained layer 14 in is a strained state. In the strained state, the crystalline structure of the strained layer 14 is elastically strained in tension or compression, with a lattice parameter that is substantially different from its nominal lattice parameter.

The interface layer 12 is preferably grown epitaxially on the support substrate 10, and the strained layer 14 is preferably grown epitaxially on the interface layer 12. Preferred methods of epitaxial growth include CVD (Chemical Vapor Deposition) and MBE (Molecular Beam Epitaxy) techniques, for group IV materials. Other suitable methods of providing the interface and strained layers 12, 14 can alternatively be used as known in the art. Solid phase epitaxy (SPE) can alternatively be used, in which an amorphous layer is deposited at a low temperature on a clean surface of the support substrate and is then crystallized at a substantially higher temperature. Metal-organic CVD (MOCVD) or liquid phase epitaxy (LPE) can be used for compound semiconductors, such as the GaAs and InP families.

Subsequently, the strained layer 14 is relaxed to a relaxed state in which the layer 14 is substantially relaxed compared to in the strained state. Most preferably, however, crystalline material of layer 14 in the relaxed state has a lattice parameter that is about equal to its nominal lattice parameter at its present temperature. To achieve this relaxation of the strained layer 14, the interface layer 12 is preferably melted sufficiently to substantially uncouple layer 14 from the support substrate 10 to relax layer 14 from its strained state to the relaxed state. The melted material of the interface layer 12 is then solidified, preferably with layer 14 in the relaxed state, to obtain a first wafer structure in which layer 14 is in the relaxed state, and more preferably is substantially completely relaxed. A sufficient melting can be accomplished by surpassing the melting temperature of the interface layer 12, or its solidus temperature, sufficiently to uncouple the layer 14 from the support substrate to allow the relaxation to occur. As used herein, the term "melting temperature" applies to the melting temperature of a material that has a single melting temperature in which it transitions from a solid to a liquid state, and also applies to the solidus temperature of a material, above which temperature a liquid or non-solid phase becomes present. In some embodiments, the melting temperature reached can be the liquidus temperature of the material, above which only a non-solid phase or a liquid phase exists. Other appropriate temperatures may be used for the interface layer at which this layer is softened sufficiently to allow the layer 14 to relax.

Although various methods of melting the interface layer 12 can be used, a preferred method includes making the interface layer 12 of a material with a lower solidus temperature than the solidus temperature of layer 14, and preferably also than that of the material of the support substrate 10. Preferably, the solidus temperature, and more preferably also the liquidus temperature, of the material of the interface layer 12 are lower than the corresponding temperatures of the materials of the support substrate 10 and layer 14.

The material of the interface layer 12 is preferably pseudomorphic as provided on the support substrate 10. In a preferred embodiment, the layer 14 to be relaxed comprises silicon germanium of a predetermined composition. With the support substrate 10 made of silicon or a silicon alloy, the interface layer 12 can be made of germanium or a silicon germanium alloy, preferably having a higher concentration of germanium than layer 14. Increasing the germanium concentration in a silicon germanium material decreases both its solidus and liquidus temperatures, as known in the art. Preferably, the solidus temperature of the interface layer is at least about 5° C. lower than that of at least one of the support substrate 10 and layer 14, more preferably at least about 10° C. lower, still more preferably at least about 50° C. lower, and most preferably at least about 100° C. or 200° C. lower. The difference in temperatures can suitably be over 500° C. The concentration of germanium in the material of interface layer 12, which can be pure germanium or silicon germanium, is at least about 5% higher, and more preferably at least about 10% or 25% higher, than in a silicon germanium material of the layer 14 to be relaxed. In one embodiment, for example, the support substrate 10 is made of silicon, the interface layer is made of germanium, and the strained layer is made of SiGe with about 10% germanium. The preferred germanium layer is preferably extremely thin compared to the adjacent layers, preferably having a thickness of less than 10 angstroms.

Figure 2:
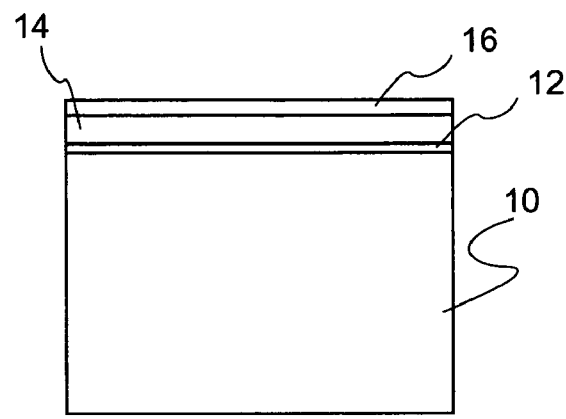
FIG. 2 shows another embodiment that employs a cap layer.

In another embodiment, shown in FIG. 2, a cap layer 16 is provided on the layer 14 to protect the surface of layer 14 during the melting of the interface layer 12. The cap layer 16 preferably protects layer 14, for example by protecting it against the effects of annealing and providing supportive mechanical strength to the strained layer 14, which can be beneficial to prevent buckling or other deformation that can lead to the lifting off of the layer 14 from the interface layer 12 or that can lead to pinholes or other defects in layer 14.

The cap layer 16 can be applied by a suitable method, such as deposition or epitaxial growth. In a preferred method, the cap layer 16 is made of silica (SiO2), which can be formed by known methods, including oxide deposition and thermal oxidation of a surface portion on layer 14 or of an additional silicon layer. Such oxide depositions can include, for example, TEOS, which can be less than 100% SiO2. Other suitable materials for the cap layer 16 include silicon nitride and silicon oxynitride.

Figure 3:
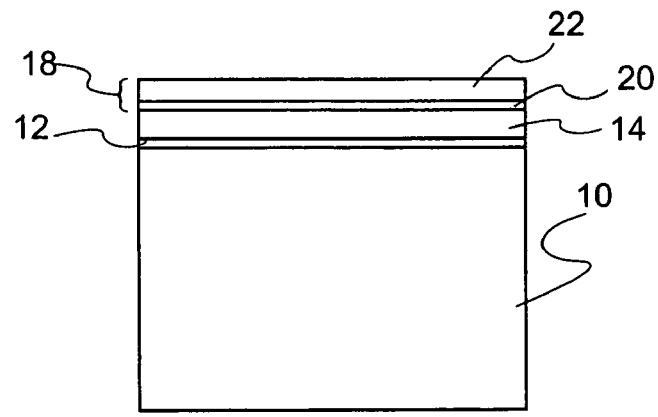
FIG. 3 shows a further embodiment in which the cap layer includes sublayers.

Referring to FIG. 3, a cap layer 18 can include a plurality of sublayers 20,22. In one embodiment, outer cap sublayer 22 is made of silica, while the inner cap layer 20, which functions as a boundary layer interposed between the outer cap sublayer 22 and the strained layer 14, is made of germanium or silicon germanium. The inner sublayer 20 in this embodiment separates the strained layer 14 from the outer cap sublayer 22 to protect the strained layer 14 from additional stress or reduce the diffusion from the outer sublayer 22 into the strained layer 14, or diffusion in the other direction.

Preferably, the melting temperature, of the sublayers 20,22 of the cap, and most preferably especially of any sublayer providing mechanical strength to the layer 14, which in this embodiment is the outer sublayer, is also higher than the corresponding temperatures of the interface layer 12. Thus, the interface layer 12 melts sufficiently to relieve the strains in layer 14, while the cap layer remains solid, or sufficiently solid to provide sufficient protection and support to the layer 14 to be relaxed during the melting of the interface layer 12. In one embodiment, however, the inner cap or layer or boundary layer 20 is made of the interface layer 12 material. In another embodiment the entire cap is melted along with the interface layer.

The strained layer 14 is preferably formed with a very high quality crystalline material with few extended crystallographic defects, such as dislocations. The material selected for the support substrate 10 is preferably selected such that in the vicinity of its interface with interface layer 12, there is a sufficiently small difference between the lattice parameter of the support substrate 10 and the nominal lattice parameters of the interface layer 12 and the strained layer 14 to minimize defects. For example, the difference between the support substrate or interface layer 12 lattice parameter and the nominal lattice parameter of the strained layer 14 is typically about 0.5% and 1.5%, but may alternatively have higher values, such as if the strained layer 14 is very thin. For example, in group IV materials, Ge has a nominal lattice parameter of about 4.2% grater than that of Si, and SiGe30% (containing 30% Ge) has a nominal lattice parameter of about 1.15% greater than that of Si, which reduces or eliminates the defects produced in the grown strained layer 14. Suitable materials from groups III-V can be used in the present invention, such as GaAs, InP, and InSb.

Preferably, to prevent the strained layer 14 from relaxing by the appearance of internal stresses that can produce plastic deformation therein, the thickness of the strained layer 14 is preferably less than a critical elastic-strain thickness. This critical elastic-strain thickness, as known in the art, depends primarily on the material selected for the strained layer 14 and also on the difference between the nominal lattice parameter of the strained layer 14 material and the lattice parameter of the material of which is grown. The critical elastic-strain thickness for the particular combination can be determined by one of ordinary skill in the art. Once formed, the strained layer 14 preferably has a lattice parameter that is substantially similar to that of the support substrate 10, providing the elastic strain in compression or tension.

The interface layer 12, and preferably any boundary layers 20 of the cap layer 18 are preferably significantly thinner than and are preferably thin films compared to the strained layer 14. Strained Si films are typically about between 10-60 nm in thickness, corresponding to the lattice parameter of SiGe20%. For higher strain values, the film would be thinner, and a thin interface layer can be around 0.5 nm in thickness. Providing thin-film layers allows the lattice parameter of the surface of the support substrate 10 on which the interface layer 12 is provided to be substantially retained in the interface layer 12. Additionally, providing the boundary layer 20 as a thin film compared to the strained layer 14 decreases or eliminates defects in the strained layer 14 produced by any strains in the boundary layer.

The melting of the interface layer 12 can be accomplished by annealing the assembled wafer or by other suitable methods of applying heat. To resolidify the interface layer 12, this layer and preferably the entire wafer is cooled to below the melting, and preferably solidus, temperatures of the materials thereof. The heating and cooling of the desired portion of the interface layer 12 to effect the relaxation of layer 14 is preferably carried out in a sufficiently short period of time, such as from a small fraction of a second to a few seconds, such as about 0.2 seconds to about 3 seconds, to prevent any substantial diffusion between the material of the interface layer 12 and layer 14. A preferred method of heating the wafer, and thus the interface layer 12, is by using RTA spike annealing (rapid thermal annealing). For a layer 14 made of SiGe20%, having 20% germanium for example, the RTA spike can be carried out to raise the temperature of the interface layer 12 to about 1200° C. With this embodiment of layer 14, the interface layer 12 can have a Ge content of greater than 20%.

Figure 4:
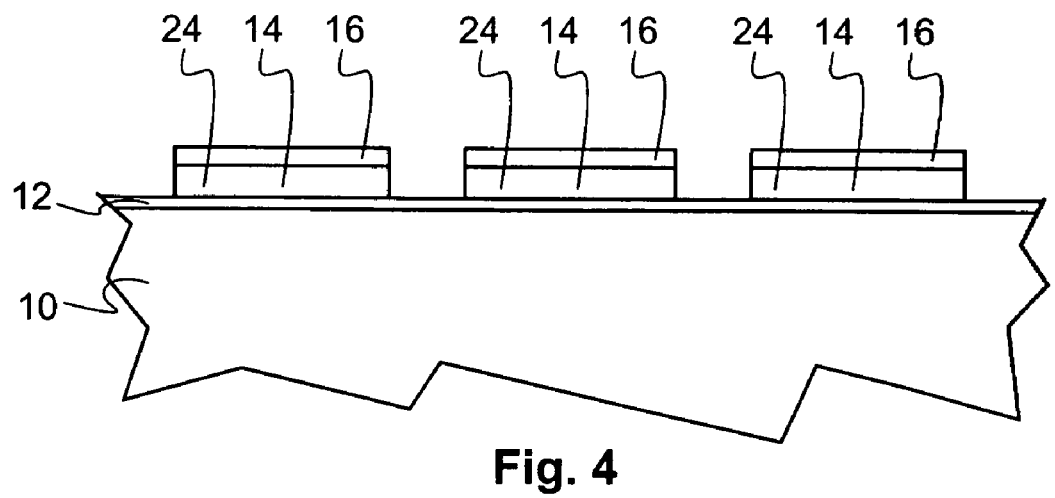
FIGS. 4 and 5 are side, diagrammatic, partial views of a wafer embodiments with a patterned strained layer.
Figure 5:
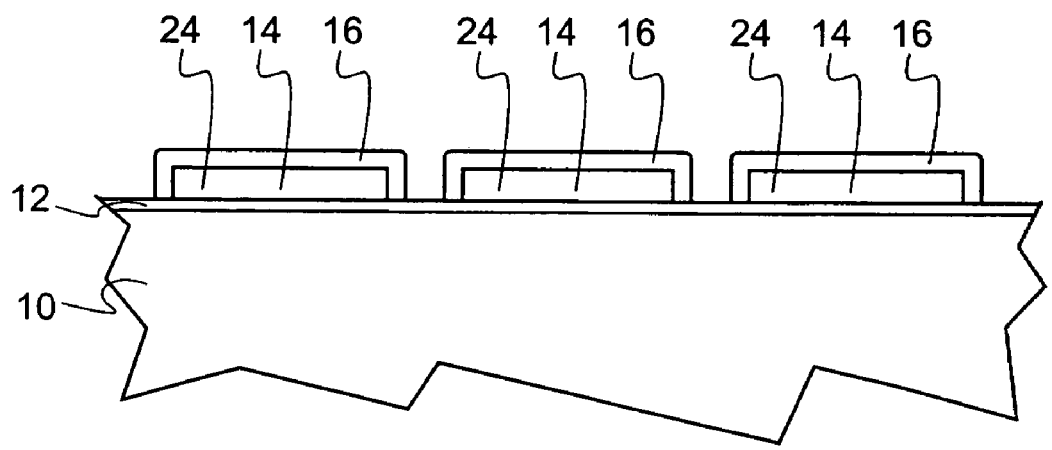

In the embodiment of FIG. 4, the strained layer 14 is patterned to provide substantially separate regions 24 of the layer 14. The patterning can be performed to eliminate or reduce areas that can constrain the relaxation and further reduce any defects produced by the relaxing of the strained layer 14. The patterning can be carrier out by methods known in the art, including wafer lithography and selective etching and is preferably conducted after all the layers 12, 14, and 16 have been provided to avoid or reduce areas in subsequently applied layers that can form boundaries around the strained layer regions 24 and which can constrain the relaxation. FIG. 5 shows an embodiment in which the strained layer 14 is patterned before the cap layer 16 is applied. The cap layer 16 in this embodiment also extends along the lateral edges of regions 24 to protect these edges. The interface layer 12 can be continuous between the regions 24 or can be discontinuous between the regions 24, such as by etching the interface layer 12 along with the layer 14. If desired, all or part of the cap layer 16 can be removed, such as by etching or polishing operations or other methods of layer removal known in the art.

Figure 6:
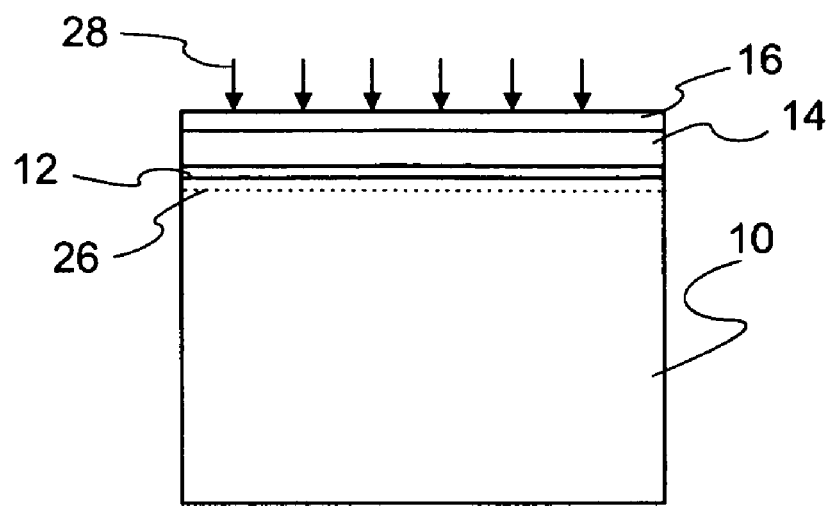
FIG. 6 is a side, diagrammatic view of a wafer during implantation of atomic species to form a region of weakness.

Once layer 14 has been relaxed, a variety of processes may be carried out. As shown in FIG. 6, a region of weakness 26 can be formed in one of the layers, such as in the support substrate. Suitable methods include implantation of atomic species 28 such as hydrogen or helium ions at a predetermined depth. This can be performed in a layer transfer technique, such as the technique known as to those skilled in the art Smart-Cut®. Receiving substrate 30 can be associated, preferably by bonding, with the donor wafer 32, which in these examples includes the stack of layers in a composite structure extending from the support substrate 10 through layer to be relaxed 14, and through the cap 16 if a cap layer is used. A portion then can be detached as a detached wafer 34 from the remainder of the donor wafer 32, which in the embodiment shown is a portion of support substrate 10. This can be accomplished, for example by supplying energy to the region of weakness, such as by a heat or mechanical treatment or with another supply of energy, to detach wafer 34 at or near the region of weakness 26. Although the region of weakness 26 is shown as being in a portion of the support substrate 10 in FIG. 7, in alternative embodiments, the region of weakness can be formed in different layers of the donor wafer. In one embodiment, the cap 16 is removed after the relaxation, and an oxide is deposited on layer 14 to become a buried oxide (BOX) layer after the bonding and detaching of the layer transfer.

An alternative method of forming a region of weakness is by producing a porous layer such as by anodization or other technique. One such technique is disclosed in document EP 0 849 788 A2. These and other techniques, can thus be used to transfer the relaxed layer 14 to another substrate or wafer. Preferably, the transfer is accomplished after relaxing the layer 14.

Other techniques can be carried out on the assembled wafer embodiments, including the embodiments shown in FIGS. 2 and 3, to facilitate the transfer of the desired layers or for other purposes. Chemical and/or chemical/mechanical material removal processes can be used. Selective etching of layers can be employed to remove these layers, such as by an etchback processes. Wet etching can be carried out using etching solutions selective to the materials to be removed, and dry etching can alternatively or additionally be employed, such as plasma etching or sputtering. Etching operations may include chemical, electromechanical, photo electromechanical processes or combinations of these. Etching operations may be preceded, followed, or accompanied by mechanical operations on the wafer, such as lapping, polishing, mechanical etching or sputtering of atomic species. Mechanical processes can include polishing, optionally combined with the action of mechanical abrasives, such as in a CMP process. These processes can be applied to simply remove a portion of the wafer, such as the cap layer 16, or to prepare for subsequent process use such as bonding to a receiving substrate or wafer 30.

Figure 7:
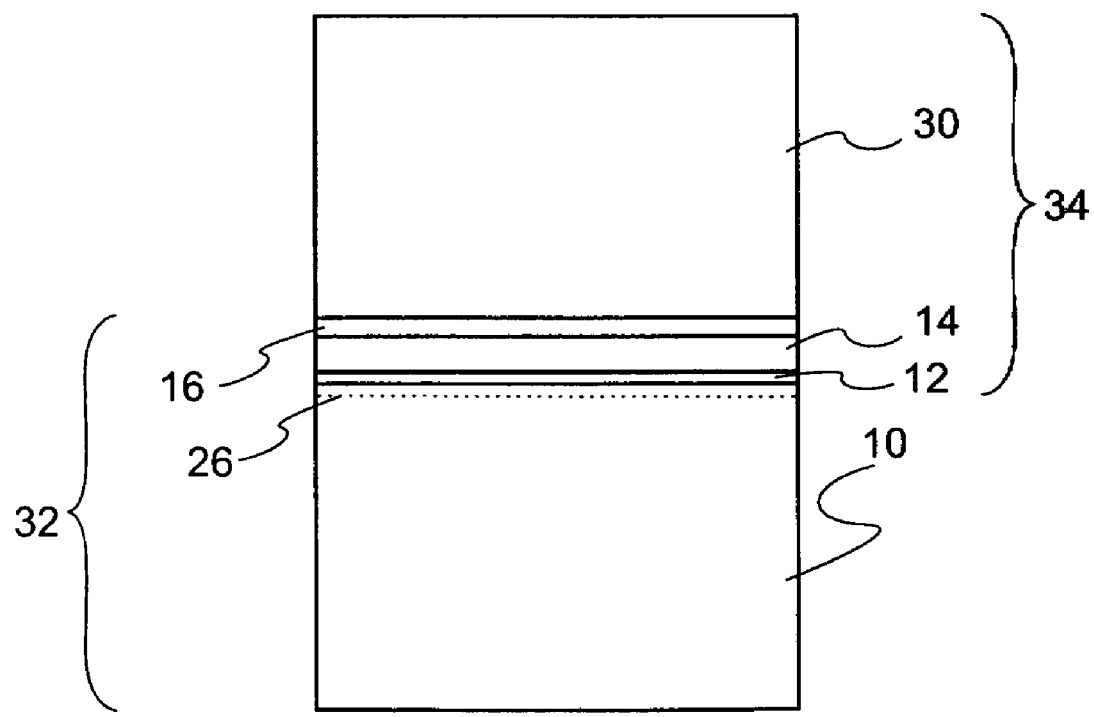
FIG. 7 is a side, diagrammatic view of a wafer during a layer detachment and transfer process.

Surface finishing techniques can be carried out on desired layers, such as chemical etching, CMP polish, heat treatments, or other smoothing operations. For example, after the transfer of the embodiment of FIG. 7 is completed, the transferred portion of the support substrate can be removed by a suitable technique, such as selective etching. The interface layer 12 can also be removed if desired, such as to provide a silicon-on-insulator ("SOI") wafer, such as where the receiving substrate 30 is made of silicon, the cap layer 16 is made of an insulator such as silica, and layer 14 is made of silicon. Surface finishing techniques can be especially useful when the relaxed layer 14 is to be used as an active layer in a semiconductor device.

In one embodiment, to obtain a strained SOI (SSOI), preferably without a SiGe layer, a strained Si layer is grown directly on fully relaxed layer 14 before implantation for a layer transfer, but after the sublayers 20 and 22 are removed. A high quality strained Si layer can be grown epitaxially, such as by CVD, on layer 14. Oxide can then be deposited, followed, for example, by a surface smoothing treatment. The strained Si layer and all or part of layer 14 is then preferably transferred to a receiving wafer, and any remaining portion of layer 14 that was transferred is removed, such as by etching, so that only the strained SOI layer remains in an SSOI configuration.

Once a final desired structure is achieved, preferably including the relaxed layer 14, a finishing step as known in the art may optionally be carried out including an annealing operation to further strengthen bonding interfaces with a receiving substrate 30.

While illustrative embodiments of the invention are disclosed herein, it will be appreciated that numerous modifications and other embodiments may be devised by those skilled in the art. For instance, various embodiments are used for manufacturing wafers for electronic and optoelectronic components. Therefore, it will be understood that the appended claims are intended to cover all such modifications and embodiments that come within the spirit and scope of the present invention.

What is claimed is:

1. A method of fabricating a crystalline wafer, comprising:
    associating an interface layer with a support substrate;
    associating a first layer in a strained state with the interface layer and support substrate;
    associating a cap layer with the first layer;
    melting the interface layer sufficiently to substantially uncouple the first layer from the support substrate to relax the first layer from the strained state to a relaxed state in which the first layer is more relaxed than in the strained state, wherein the cap layer protects and provides mechanical support for the first layer when the interface layer is melted; and
    solidifying the interface layer with the first layer in the relaxed state to obtain a first crystalline wafer that includes the support substrate, the interface layer and the first layer in the relaxed state,
    wherein the first layer comprises silicon germanium, and the interface layer comprises a higher concentration of germanium than the silicon germanium in the first layer.

2. The method of claim 1, wherein the interface material comprises germanium or silicon germanium.

3. The method of claim 1, wherein the interface layer is a thin film compared to the first layer.

4. The method of claim 1, wherein the interface layer is grown epitaxially on the support substrate.

5. The method of claim 1, wherein the first layer is patterned to sufficiently separate regions of the first layer for reducing constraints to the relaxation thereof between the regions.

6. The method of claim 1, further associating a surface of the first wafer opposite from the support substrate with a receiving substrate.

7. The method of claim 6, further comprising detaching at least a portion of the first layer from at least a portion of the support substrate for transferring to the receiving substrate.

8. The method of claim 1, wherein the support substrate has a support lattice parameter, and the first layer has a first nominal lattice parameter that is different than the support lattice parameter.

9. The method of claim 1, wherein the first layer is epitaxially grown in association with the interface layer.

10. The method of claim 1, wherein the first layer is substantially completely relaxed in the relaxed state.

11. A method of fabricating a crystalline wafer, comprising:
    associating an interface layer with a support substrate;
    associating a first layer in a strained state with the interface layer and support substrate;
    associating a cap layer with the first layer;
    melting the interface layer sufficiently to substantially uncouple the first layer from the support substrate to relax the first layer from the strained state to a relaxed state in which the first layer is more relaxed than in the strained state, wherein the cap layer protects and provides mechanical support for the first layer when the interface layer is melted; and
    solidifying the interface layer with the first layer in the relaxed state to obtain a first crystalline wafer that includes the support substrate, the interface layer and the first layer in the relaxed state, wherein the cap layer includes a sublayer thereof associated with the first layer, and wherein the sublayer protects the first layer from stress imparted by the cap when the interface layer is melted.

12. The method of claim 11, wherein the sublayer melts, but remains associated with the first layer, during the step of melting the interface layer.

13. The method of claim 1, wherein the cap layer is $SiO_2$.

14. The method of claim 11, wherein the first layer is made of a first material, the support substrate is made of a support material, and the interface layer is made of an interface material that has an interface melting temperature that is lower than the melting temperatures of the support and first materials.

15. The method of claim 14, wherein the melting temperature of the interface material is at least about 5° C. lower than the melting temperature of each of the first and support material.

16. The method of claim 14, wherein:
the interface layer is melted by heating at least to the interface melting temperature a portion of the interface material sufficient to allow the first material to relax; and
the interface layer is solidified by cooling the interface material.

17. The method of claim 16, wherein the interface layer is cooled at a sufficiently rapid rate to solidify the interface layer sufficiently rapidly to avoid substantial diffusion of the interface and first materials therebetween.

18. The method of claim 16, wherein the interface layer is heated by applying heat to the first and interface layers and to the support substrate.

19. The method of claim 16, wherein the interface layer is heated by rapid thermal annealing.

20. The method of claim 1, which further comprises associating a boundary layer with the first layer such that the boundary layer is disposed between the first layer and the protective cap layer.

21. The method of claim 20, wherein the boundary layer is configured for separating the first layer from the protective cap layer to substantially prevent diffusion therebetween during the heating.

22. The method of claim 20, wherein the boundary layer is made of the interface material.

23. The method of claim 20, wherein the interface and boundary layers are thin films compared to the first layer.

24. The method of claim 20, further comprising melting the boundary layer to uncouple the first layer from the protective cap layer to inhibit or prevent the protective cap layer from impeding the relaxation of the first layer.

* * * * *

UNITED STATES PATENT AND TRADEMARK OFFICE
CERTIFICATE OF CORRECTION

PATENT NO. : 7,585,792 B2
APPLICATION NO. : 11/052885
DATED : September 8, 2009
INVENTOR(S) : Celler It is certified that error appears in the above-identified patent and that said Letters Patent is hereby corrected as shown below:

Title Page:
Item (56) References Cited, FOREIGN PATENT DOCUMENTS, after "EP 0 849 788 A2", delete "12/1997" and insert -- 6/1998 --.
Item (56) References Cited, OTHER PUBLICATIONS, Hollander et al. reference, before "Instruments" delete "and".
Add the following references:
-- M. Kostrzewa et al., Article: "Feasibility of III-On-Silicon Strain Relaxed Substrates," pp. 1-22 --.
-- M. Kostrzewa et al., "Feasibility of Strain Relaxed InAsP and InGaAs Compliant Substrates," IPRM (2003) --.
Item (57) ABSTRACT, after "from the strained" delete "to".

Signed and Sealed this

Tenth Day of November, 2009

David J. Kappos
*Director of the United States Patent and Trademark Office*